United States Patent [19]

Dumas et al.

[11] Patent Number: 4,959,121
[45] Date of Patent: Sep. 25, 1990

[54] METHOD FOR TREATING A POLYIMIDE SURFACE FOR SUBSEQUENT PLATING THEREON

[75] Inventors: William V. Dumas, Essex Junction, Vt.; Donald F. Foust, Scotia, N.Y.

[73] Assignee: General Electric Company, Schenectady, N.Y.

[21] Appl. No.: 461,579

[22] Filed: Jan. 5, 1990

[51] Int. Cl.$^5$ .................. B44C 1/22; B29C 37/00; C03C 15/00; C03C 25/06
[52] U.S. Cl. .................. 156/668; 156/651; 156/654; 204/30; 252/79.2; 252/79.4; 252/79.5; 427/306; 427/307
[58] Field of Search .............. 156/651, 654, 668, 902; 252/79.2, 79.4, 79.5; 427/98, 306, 307; 204/30, 32.1, 38.4, 38.5, 38.7; 428/209, 601, 626, 458, 474.4, 901

[56] References Cited

U.S. PATENT DOCUMENTS

| | | | |
|---|---|---|---|
| 3,011,920 | 12/1961 | Shipley, Jr. | 117/213 |
| 3,523,874 | 8/1970 | Dey | 204/30 |
| 3,562,005 | 2/1971 | DeAngelo et al. | 117/212 |
| 3,589,916 | 6/1971 | McCormack | 106/1 |
| 3,841,881 | 10/1974 | Feldstein et al. | 106/1 |
| 3,983,093 | 9/1976 | Williams, III et al. | 260/47 CP |
| 4,360,633 | 11/1982 | Bolon et al. | 524/845 |
| 4,525,508 | 6/1985 | Lee, Jr. | 524/140 |
| 4,775,449 | 10/1988 | Dumas et al. | 204/30 |
| 4,803,097 | 2/1989 | Fraenkel et al. | 427/307 |
| 4,806,395 | 2/1989 | Walsh | 427/444 |
| 4,810,333 | 3/1989 | Gulla et al. | 204/15 |
| 4,842,946 | 6/1989 | Foust et al. | 428/458 |
| 4,873,136 | 10/1989 | Foust et al. | 428/209 |

FOREIGN PATENT DOCUMENTS 3437084 10/1984 Fed. Rep. of Germany .
60-71560 4/1985 Japan .
2123036 6/1983 United Kingdom .

OTHER PUBLICATIONS

Kirk-Othmer Encyclopedia of Chemical Technology, Third Edition, vol. 18.
C.A. 84(22): 151371g.
C.A. 84(24): 165531W.
Kirk-Othmer Encyclopedia of Chemical Technology, Third Edition, vol. 8.
Margolis, Decorating Plastics, 1986, pp. 44–45.
Reid and David, Plating and Surface Finishing, Jan. 1987, pp. 66–70.
Lowenheim, Modern Electroplating, Third Edition, pp. 183–203.
Foust and Dumas, Application Ser. No. 331,715, filed Apr. 3, 1989.
Foust and Bernstein, Application Ser. No. 402,372, filed Sep. 5, 1989.

*Primary Examiner*—William A. Powell
*Attorney, Agent, or Firm*—William H. Pittman; James C. Davis, Jr.

[57] ABSTRACT

A polyimide surface is pretreated in preparation for an adhesion promotion treatment and subsequent metallization on the surface, wherein the pretreatment comprises the steps of:
(A) contacting the polyimide surface with an aqueous solution of nitric acid having a concentration of about 35 to about 70% by weight or an aqueous solution of hydrochloric acid having a concentration of about 10 to about 38% by weight;
(B) rinsing the acid-treated polyimide surface with water so as to substantially remove the acid from the surface of the polyimide;
(C) contacting the rinsed polyimide surface with a mild etching agent, resulting in the formation of a residual film on the polyimide surface;
(D) contacting the etched polyimide surface with a basic solution, and
(E) removing the residual film formed on the surface of the polyimide after contact with the mild etching agent in step (C).

The method of this invention allows both filled and unfilled polyimide substrates to be electroless plated in a consistent manner and provides improved adhesion between the polymer and subsequently deposited metals.

18 Claims, No Drawings

METHOD FOR TREATING A POLYIMIDE SURFACE FOR SUBSEQUENT PLATING THEREON

BACKGROUND OF THE INVENTION

This invention relates to a method for treating polyimide surfaces for subsequent plating thereon. More particularly, this invention relates to a method for treating polyimide surfaces so as to improve the adhesion thereon of metal deposited during subsequent plating.

Printed circuit boards have become the dominant vehicle for mounting and interconnecting electronic components in order to manufacture a desired electronic circuit. The printed circuit board usually consists of a sheet of a dielectric, i.e., a nonconductive, substrate constructed from various filled or unfilled synthetic materials such as phenolics, glass-impregnated epoxies, and the like. The substrate is provided with a pattern of thin metal foil which functions as a conductive path on one or both sides. The paths or "traces" are usually formed of a conductive material such as copper, palladium, nickel or gold, and the like. The traces collectively define all of the electrical connections between components on the board, and are routed between appropriate locations.

The thermoplastic materials such as polyimides are particularly suitable for printed circuit board substrates because of their strength, heat resistance, dimensional stability, and easy moldability. However, polyimide substrates are not easily provided with a strongly adherent metal trace. The printed circuit, i.e., the plated metal conductive path, can be damaged or separated from the substrate during subsequent manufacturing steps or during use of the circuit board.

Several attempts have been made to increase the adhesion of the conductive metal traces to the polyimide substrates. Adhesion is generally measured as "peel strength", i.e., the force under controlled conditions required to peel the trace from the substrate. Some of these efforts focus on physically modifying the as-molded polyimide surface. For example, polyimide surfaces have been grit blasted to provide a roughened surface which anchors the subsequently-applied metals. Chemical swelling agents or penetrants have been used to swell the surface, and chemical etching agents have been used to remove portions of the surface.

While the methods described above which physically modify the polyimide surface do increase adhesion, they are often not entirely satisfactory for several reasons. Such techniques result in degradation of the molecules forming the polyimide surface, and may decrease both the tensile and impact strength of the substrate due to swelling and cracking of the entire substrate material, especially in those instances in which the polyimide contains fillers. Grit blasting requires cumbersome equipment and impedes the processing of printed circuit boards.

Dissatifaction with the above-described adhesion promotion techniques led to further attempts to improve adhesion between the polyimide surface and the metallization layer. These efforts focused on improving adhesion by forming a chemical bond between the polyimide and the plated metal.

For example, U.S. Pat. No. 4,775,449 to Dumas et al. describes an adhesion promotion treatment wherein a polyimide surface is treated with an adhesion-promoting compound characterized by the presence of an >NO— moiety, such as hydroxylamine. U.S. Pat. No. 4,842,946 to Foust et al. discloses an adhesion-promotion method which uses organic double bond-containing compounds such as thiourea to treat the polyimide surface.

The methods disclosed in U.S. Pat. No. 4,873,136 and copending, commonly-owned application Ser. No. 331,715, filed Apr. 03, 1989, both to Foust et al., in addition to the adhesion-promotion steps taken in the methods described in the patents to Dumas et al. and Foust et al. above, also subject the polyimide surface to an initial surface pretreatment which involves contact of the polyimide surface with a mild etching compound for removal of the surface layer, followed by contact with a basic solution which often includes short chain alcohols, and then contact with a solution of an alcohol and another mild etching compound. This pretreatment results in a clean, water-wettable surface which is particularly suitable for the subsequent adhesion-promoting treatment.

Experiments have shown that a heat treatment following electroless plating is necessary to develop chemical adhesion and that adhesion immediately following plating is probably mechanical in nature and due to the inherent surface roughness of most filled materials.

Although the above-described methods work well with filled polyimide surfaces, electroless plating on unfilled polyimide usually results in the blistering of the copper after a minimal time in the electroless plating bath. It is believed that the lack of mechanical adhesion on the smooth unfilled polymer is responsible. Processing of samples with a thin electroless layer is difficult and oxide removal after baking further reduces the deposit thickness, possibly causing resistance problems when electrolytic plating is attempted.

It is therefore desirable to provide a method for treating the surface of a polyimide which allows both filled and unfilled samples to be electroless plated in a consistent manner.

It is further desirable to provide a method for treating the surface of a polyimide which improves the adhesion between the polyimide surface and the plated metal.

Because of the problems associated with physical modification of the polyimide surface as described previously herein, it is desirable to modify the polyimide surface by means of a chemical technique. A chemical means for modifying the polyimide surface to achieve the objectives of the present invention would allow a single adhesion system to be used for all grades of polyimide and would provide an off-line process to resolve the problems associated with the use of unfilled polyimide substrates.

The objects listed above are achieved in the present invention by treating a polyimide surface with nitric acid or hydrochloric acid prior to the etching and adhesion-promoting steps previously described herein.

The treatment of a previously etched polyimide surface with nitric acid is described in U.S. Pat. No. 4,803,097 to Fraenkel et al., which discloses a method for treating a plastic surface in preparation for subsequent electroless plating. In the Fraenkel method, the surface of a plastic, which can be polyimide, is first etched by exposure to an ozone atmosphere, then treated with a conditioning agent containing a base and an alcohol so as to remove ozone/plastic degradation products from the ozonetreated plastic surface, and then treated with an oxidizing agent, preferably nitric acid, to further etch the plastic surface.

The treatment of a polymer with nitric acid or other nitrating agent is disclosed in U.S. Pat. No. 3,523,874 to Dey, which is directed to a process for making aromatic polymer surfaces susceptible to plating or coating with metals. In the Dey method, an aromatic polymer, typically a polystyrene or phenolic resin, is contacted with nitric acid or other suitable nitrating agent to form nitro radicals on the aromatic nuclei at the surface of the polymer. The preferred nitrating agent for use in the Dey process is disclosed to be a mixture of nitric acid and sulfuric acid. The nitrated surface is then contacted with a reducing agent to convert the nitro groups to amino groups. The resulting plastic surface is treated with a diazotization agent to convert the amino groups to $N_2Cl$ groups and then contacted with an alcohol solution of hydroquinone to replace the $N_2Cl$ groups with hydroquinone radicals. The resulting plastic can then be electroless plated.

German patent No. 3437084 discloses the etching of polyetherimide and other plastics for use in the manufacture of circuit boards. The plastic is etched with a sulfuric acid containing nitrate ions, the nitrate ions being provided preferably by nitric acid or its salts.

The treatment of polyimide resin with concentrated nitric acid is also disclosed in Japanese Patent No. 61231033, which is directed to a method of pulverising polyimide resin by dipping polyimide resin into concentrated nitric acid or a mixture of concentrated nitric acid and concentrated sulfuric acid and then grinding the treated resin to form powder.

The present invention is based on the discovery that treatment of an unetched polyimide resin with nitric acid or hydrochloric acid prior to the etching and adhesion-promoting treatments described hereinafter will result in increased adhesion between the plastic and the electrolessly deposited metal.

SUMMARY OF THE INVENTION

The present invention provides a method for pretreating a polyimide surface in preparation for an adhesion promotion treatment and subsequent metallization on the surface, comprising the steps of:

(A) contacting the polyimide surface with an aqueous solution of nitric acid having a concentration of about 35 to about 70% by weight or an aqueous solution of hydrochloric acid having a concentration of about 10 to about 38% by weight;

(B) rinsing the acid-treated polyimide surface with water so as to substantially remove the acid from the surface of the polyimide;

(C) contacting the rinsed polyimide surface with a mild etching agent, resulting in the formation of a residual film on the polyimide surface;

(D) contacting the etched polyimide surface with a basic solution, and (E) removing the residual film formed on the surface of the polyimide after contact with the mild etching agent in step (C).

The method of this invention allows both filled and unfilled polyimide substrates to be electroless plated in a consistent manner and provides improved adhesion between the polymer and subsequently deposited metals.

DETAILED DESCRIPTION OF THE INVENTION

The choice of a particular polyimide material for plating according to the present invention is not critical. Polyimides are well-known in the art, and are described, for example, in the Kirk-Othmer Encyclopedia of Chemical Technology, Third Edition, Volume 18. Especially preferred polyimides for the present invention are those commonly referred to as "polyetherimides"—for example, those formed by the reaction of (2,2-bis[4-(3,4-dicarboxyphenoxy)phenyl]propane dianhydride with phenylene diamine. Examples of polyetherimides and methods for their preparation are described, for example, in U.S. Pat. Nos. 3,983,093 and 4,360,633, issued to Williams, III et al. and Bolon et al., respectively. Both of these patents are incorporated herein by reference.

The polyimides may contain various amounts of fillers or reinforcing agents, all of which are well-known in the art. Illustrative fillers and reinforcing agents are disclosed in U.S. Pat. No. 4,525,508, incorporated herein by reference. These materials include talcs, mica, aluminum silicates (clay), zinc oxide, calcium metaphosphate, titanium dioxide, carbon black, franklinite, precipitated or natural calcium carbonate, glass fibers, glass spheres, siliconepolyimide copolymeric materials, carbon fibers, and the like, as well as mixtures thereof.

Although filled grades of polymer may be treated according to the present invention, the adhesion from the pretreatment with nitric acid as described below is usually lower than that observed without the pretreatment.

These polyimides may of course contain various other additives, such as pigments, ultraviolet radiation absorbing agents, impact modifiers, plasticizers, antioxidants, stabilizers, processing aids, antistatic agents, and the like.

The substrates of the present invention may be in a variety of shapes and sizes. For example, the substrate may be a printed circuit board having flat or curved surfaces, which can also include various cavities, raised regions, and through-holes; and can comprise two or more discrete polyimide layers, e.g., a multi-level circuit board.

The polyimide surface should be degreased before any further steps are taken. The term "degreased" means a polyimide substrate having its surface free of oil, molding compounds, finger prints or extraneous material. Various degreasing agents may be used, with the proviso that they not in any way degrade the polyimide surface. Suitable degreasing agents include detergents such as Shipley Acid Cleaner 1118 and Shipley Cleaner-Conditioner 1175A, both available from the Shipley Company, Metex 9627, a product of the MacDermid Corporation, and Microdetergent, available from the International Products Corporation. Other suitable degreasing agents include halo hydrocarbon Freon ® solvents, such as 1,1,2-trichloro-1,2,2-trifluoroethane and mixtures of 1,1,2-trichloro-1,2,2-trifluoroethane with acetone or methanol and nitromethane. In the event that one of the detergents mentioned above is used, it is essential that the substrate be perfectly dry prior to contact with the nitric acid or hydrochloric acid. Residual water will cause the concentration of the acid to decrease. In addition, water droplets on the polyimide surface will act like grease residues, preventing the diffusion of the acid into the polyimide. In both cases, decreased adhesion will result.

After the initial degreasing step, the polyimide surface is treated with either nitric acid or hydrochloric acid. The preferred acid for use in the present invention is nitric acid.

The nitric acid should be used at a concentration of about 35 to about 70%, preferably about 50 to about 70%, and most preferably about 65 to about 70%. The concentration of the hydrochloric acid should be about 10 to about 38%, preferably about 25 to about 38%, and most preferably about 30 to about 38%. Treatment of the polyimide surface with the acid is carried out at room temperature and typically lasts about 15 seconds to about 10 minutes. "Treatment" with acid means treating the surface of the polyimide by immersion, spraying, painting, suspension in vapor, or other forms of surface treatment.

It is preferred that over-diffusion of the nitric or hydrochloric acid into the polyimide not take place. If too much acid is present in the polyimide, over-etching of the plastic may occur, making the anchor sites less effective.

Although not wishing to be bound to any theory, it is believed that the mechanism by which nitric acid or hydrochloric acid produces an etched polyimide surface is the diffusion of the acid into the polymer, followed by preferential attack of the diffusion sites by the agent used to mildly etch the polyimide surface as described hereinafter, which results in the formation of etch pits on the surface of the polyimide.

The acid can be applied in either its liquid or its vapor phase to the polyimide surface. The polyimide sample can be completely immersed in a solution of the acid or it may be suspended in the vapors above the acid solution in a closed container. Comparable results are achieved by either technique.

In a preferred embodiment of this invention, a surfactant is added to the acid. It has been found that a concentrated strong acid is a poor wetting agent for polyimide. Polyimide samples removed from nitric acid in the method of this invention drained rapidly but unevenly. Small areas of liquid were left on the sample and the vapor effect produced uneven results. The addition of a surfactant to the nitric acid or hydrochloric acid in the present invention resolved this problem. After immersion in acid and surfactant, complete wetting of the polyimide surface was apparent and after adhesion treatment the surfaces were uniform.

The surfactant used in the present invention must be inert, i.e., it must not react with nitric acid or hydrochloric acid. Anionic fluorocarbon surfactants are suitable for use in this invention. Examples of suitable fluorocarbon surfactants include ammonium perfluoroalkyl sulfonates, potassium perfluoroalkyl sulfonates, amine perfluoroalkyl sulfonates, fluorinated alkyl amphoteric mixtures, potassium fluorinated alkyl carboxylates, fluorinated alkyl quaternary ammonium iodides, ammonium perfluoroalkyl carboxylates, fluorinated alkyl polyoxyethylene ethanols, fluorinated alkyl alkoxylates, and fluorinated alkyl esters. The preferred surfactants for use in this invention are the potassium perfluoroalkyl sulfonates and particularly the potassium perfluoroalkyl sulfonate surfactant designated "FC-98", a product of 3M Company.

The amount of surfactant which should be used in this invention is generally about 0.001% to about 1.0%, preferably about 0.01% to about 1.0%, and most preferably about 0.1% to about 1.0%, based on weight.

After the polyimide surface has been treated with nitric or hydrochloric acid, the polyimide must be rinsed extensively in order to substantially remove acid residues remaining on the surface of the polyimide. If rinsing is insufficient, the acid diffuses back into the plating bath and reacts with the metal subsequently deposited on the polyimide enough to destroy a thin layer of electroless metal. Generally, it is sufficient to rinse the polyimide with water for about 30 seconds to about 20 minutes.

After the water rinse, the polyimide surface must undergo a pretreatment regimen that will allow the polyimide surface to become chemically bonded to the electroless metal subsequently applied to it. The method of pretreatment is not critical as long as a chemical bond will be formed between the polyimide surface and the electroless metal.

Suitable methods for pretreating the polyimide surface are described, for example, in copending, commonly owned application Ser. No. 331,715, filed Apr. 03, 1989, to Foust et al, U.S. Pat. No. 4,873,136 to Foust et al., and U.S. Pat. No. 4,775,449 to Dumas et al., all of which are incorporated by reference herein in their entirety.

Generally, the pretreatment comprises mildly etching the surface of the polyimide, resulting in the formation of a residual film on the surface of the polyimide; contacting the etched polyimide surface with a basic solution; and removing the residual film formed on the surface of the polyimide after the mild etching step.

Examples of mild etching compounds suitable for use on the polyimide surface include sulfuric acid, N,N-dimethylformamide, N-methyl-2-pyrrolidone, pyridine, tetrahydrofuran, and methylene chloride.

Sulfuric acid is the preferred mild etching compound because of its low cost and miscibility with water, and is preferably used in highly concentrated form, i.e., at least about 85% for this invention.

It is critical that the polyimide surface be treated with the etching compound, e.g., sulfuric acid, after treatment with the nitric or hydrochloric acid. If the etching compound and nitric acid are applied simultaneously, a totally different type of reaction occurs at the polyimide surface. Unlike the situation in which treatment with sulfuric acid follows that with nitric or hydrochloric acid, wherein the sulfuric acid attacks the sites of diffused nitric acid to form etch pits on the polyimide surface, the simultaneous application of the etching compound and the acid uniformly attacks the plastic surface and does not form etch pits on the polyimide surface. In addition to physical differences, the surface of the plastic showed a chemical change, as shown in the examples below.

Treatment with the mild etching compound may be carried out for about 15 seconds to about 5 minutes, and is usually followed by a water rinse.

A residual film of varying thickness is formed on the polyimide surface during treatment with the mild etching compound. The film remains on the surface even after rinsing. The film can be treated with a basic (i.e., alkaline) solution for about 30 seconds to about 10 minutes which appears to modify the residual film, making it less adherent to the polyimide surface. Suitable basic solutions include those formed by dissolving 0.1 to about 10 molar (M) of a basic compound such as sodium hydroxide, potassium hydroxide, tetramethylammonium hydroxide, and mixtures thereof in a solvent such as water.

After the surface has been treated with the basic solution and rinsed, the loosened residue may be removed according to various known procedures. Removal of the residual film or white residue is essential to optimize the adhesion of any subsequently deposited electroless metal on the polyimide substrate.

According to U.S. Pat. No. 4,775,449 to Dumas et al., previously cited and incorporated by reference herein, the loosened residue can be removed by treatment with a solution comprising an alcohol and one of the etching solvents described above, with the proviso that the etching solvent be one which would not react with the alcohol. For example, sulfuric acid reacts with methanol and thus would not be suitable for use in this step. Methanol is the preferred alcohol because of its ability to quickly remove the loosened residue. In the method disclosed in U.S. Pat. No. 4,873,136 to Foust et al., the film residue is removed by contacting of the surface with a cationic surfactant. The central atom of this type of compound is usually a nitrogen or phosphorus cation, and often bonds to one or more organic side chains, e.g., quaternary ammonium salts, or is part of an organic heterocyclic system such as pyridine. The preferred cationic surfactants are cetylpyridinium chloride monohydrate, cetylpyridinium bromide monohydrate, dodecyltrimethylammonium bromide, and hexadecyltrimethylammonium bromide. In terms of cost, availability and effectiveness, cetylpyridinium chloride monohydrate is most preferred.

In a preferred method for removing the loosened residue from the polyimide substrate, as disclosed in the application to Foust et al., Ser. No. 331,715, filed Apr. 03, 1989, after the polyimide has been treated with the basic solution and rinsed, the substrate is immersed into an aqueous solution of an alkali metal permanganate, and optionally an alkali metal hydroxide.

Treatment with the permanganate solution should be carried out at a temperature of 25° C. to 85° C. for a period of 2 to 20 minutes. The alkali metal permanganate preferably includes potassium or sodium permanganate.

After rinsing, the treated polyimide substrate is found to be completely free of the loosened residue but a manganese oxide residue remains on the polyimide surface. The manganese residue is readily removed by treating the polyimide substrate with a reducing agent, such as an aqueous solution of hydroxylamine hydrochloride by immersing the polyimide substrate into the reducing bath. The resulting polyetherimide substrate can then be rinsed and allowed to dry to form a polyetherimide substrate having a chemically altered surface rendering it hydrophilic. Even after an extended period of time, the modified surface of the polyetherimide substrate is capable of being activated with a tin-palladium colloid in a standard manner and metallized with a electrolessly deposited metal such as copper. Superior adhesion between the deposited metal and the polyimide surface can be achieved, without the use of an adhesion promoter, such as thiourea.

If the polyimide surface is pretreated according to the methods disclosed in U.S. Pat. No. 4,775,449 to Dumas et al. or U.S. Pat. No. 4,873,136 to Foust et al., adhesion-promotion treatments, as detailed in those patents, which are incorporated by reference herein, are needed.

In the adhesion-promoting procedure described in the Dumas et al. patent, the polyimide surface is treated with an adhesion promoter characterized by the presence of an >NO— moiety. Such adhesion-promoting compounds include O, N-dimethylhydroxylamine hydrochloride, acetone oxime, 2-pyridine aldoxime, N-hydroxyphthalimide, and 1-hydroxybenzotriazole·H$_2$O. An especially preferred adhesion-promoting compound of this type is hydroxylamine, or a salt of hydroxylamine.

The adhesion-promoting compounds disclosed in the patent to Foust et al., U.S. Pat. No. 4,842,946, above incorporated herein by reference, are also suitable for use in the present invention. These compounds contain an organic double bond and include thiosemicarbazide hydrochloride, 2,4-dithiobiuret, semicarbazide hydrochloride, acetylthiourea, thiourea, acetamide, urea, N,N-dimethylacetamide, thioacetamide, and thiocyanuric acid. The most preferred adhesion-promoting compound of this type is thiourea.

After treatment with adhesion-promoting compound, the polyimide substrate may be thoroughly rinsed with water and then activated for plating by methods well-known in the art and described, for example, in U.S. Pat. No. 3,589,916, as well as in the Foust et al. and Dumas et al. applications discussed above. For example, the substrate may be contacted with an acid solution of a precious metal, such as palladium chloride in hydrochloric acid, for a period of time sufficient to cause catalytic activation of the substrate surface.

It is often useful to begin the activation of the substrate by treatment with an additive which aids in absorption of the plating catalyst Such additives are well-known in the art. Exemplary aids to catalyst absorption include Shipley 1175A, a product of the Shipley Company, and Metex 9420, a product of the MacDermid Corporation.

One illustrative activation technique involves immersing the substrate in a solution of Shipley Cataprep ® 404, a product of the Shipley Company. This solution provides a protecting agent for the plating catalyst subsequently applied, and comprises sodium bisulfate and various surfactants. The substrate may then be immersed in a solution of Shipley Catapostt ® 44, which contains the Cataprep ® 404 ingredients, tin, and palladium, which is the electroless plating catalyst. After a water rinse, the substrates may then be immersed in a solution of Shipley Cuposit ® Accelerator 19, a fluoroboric acid-containing formulation used to separate tin from the plating catalyst.

Activation and plating processes suitable for the present invention are also described in U.S. Pat. Nos. 3,011,920 and 3,841,881, issued to Shipley and Feldstein et al., respectively, both of which are also incorporated herein by reference.

After surface activation and rinsing, electroless plating can be undertaken. Electroless baths are well-known in the art and are generally described in the Kirk-Othmer Encyclopedia of Chemical Technology, 3rd Edition, Volume 8, the contents of which are incorporated herein by reference. The selection of a particular bath or electroless plating process is not critical to the present invention. The contents of the bath and the particular plating parameters, e.g., temperature, pH, and immersion time, will of course depend on the particular plastic serving as the substrate, and also upon the particular metal being deposited thereon. Suitable plating baths include the Shipley Cuposit ® 250 system and the Enthone ® 406 system. Furthermore, the Dumas et al. patent mentioned above lists suitable electroless plating formulations. Immersion times, bath temperatures, and other operating parameters can be determined and controlled according to manufacturers' suggestions. Those having ordinary skill in the plating arts will be able to determine the most appropriate plating regimen for a particular situation.

The polyimide surface can then be subjected to a heat treatment after electroless deposition of the metal. Oven heating of the entire article, i.e., substrate with metal thereon, is sufficient, although any heating method is suitable.

If another layer of metal is to be applied on the surface, e.g., by electroplating, the above-described heat treatment can in some instances be omitted if a heat treatment is used after the plating of more of the metal, as described below. However, preferred embodiments include the heat treatment prior to the deposition of more of the metal. Most preferred embodiments include a heat treatment prior to the deposition of more of the metal (i.e., after the electroless deposition), along with another heat treatment after the final layer of metal has been applied, as described below.

Electroplating is the preferred application method for the second metal layer. The substrate is usually cleaned prior to immersion in the electroplating bath. The cleaning can be performed by rinsing the substrate with a dilute solution of a strong acid, such as 10% by weight sulfuric acid in water.

The electrolytic metal layer may be deposited according to electroplating plating processes known in the art. Typically, the electroplating bath for copper is operated at a temperature ranging from about 16° C. to about 38° C., with a cathode current density in the range of about 1 ASF to about 80 ASF. The thickness of the electrolytically-applied metal layer will depend upon the desired end use of the metal-coated substrate.

After deposition of the electrolytic layer, the substrate may be rinsed again with water and then heat-treated to further enhance adhesion of the electroless metal layer to the substrate. A typical heat treatment for this step involves temperatures ranging from about 75° C. to about 150° C. for a time period ranging from about 1 hour to about 24 hours.

The result of the electrolytic deposition is a metallized polyimide composite having a smooth, bright metal layer and a high level of adhesion between the electroless metal layer and the polyimide substrate.

The metal applied onto the polyimide substrate may be in the form of a pattern. Exemplary patterning methods are also described in U.S. Pat. No. 3,562,005, issued to DeAngelo et al. and incorporated herein by reference.

The electrolytic bath for the electrolytic layer can be one of the conventional baths known in the art. These baths contain effective amounts of brighteners and levelling agents, as well as other additives, all of which are known in the art and are described, for example, in *Decorating Plastics,* edited by James M. Margolis, Hanser Publishers, 1986; by J. D. Reid and A. P. David in *Plating and Surface Finishing,* January 1987, pp. 66–70; in *Modern Electroplating,* edited by Frederick A. Lowenheim, Third Edition, John Wiley and Sons, Inc.; and in the United Kingdom Patent application of D. Morrissey et al, GB No. 2123036A.

Non-limiting examples of brighteners, some of which can also function as levelling agents, include organic disulfide compounds, e.g., aromatic, heterocyclic and aliphatic disulfide compounds; aromatic sulfonic acids, e.g., benzene sulfonic acid, 1,3,6-naphthalene sulfonic acid and the like; aromatic sulfonamides, e.g., p-toluene sulfonamide and the like; aromatic sulfonimides, e.g., o-benzoic sulfonimide (saccharin) and the like; heterocyclic sulfonic acids, e.g., thiophen-2-sulfonic acid and the like; aromatic sulfinic acids, e.g., benzene sulfinic acid and the like; and ethylenic aliphatic sulfonic acids, e.g., allyl sulfonic acids and the like.

Non-limiting examples of suitable levellers include polyorganic oxides and those described, for example, in U.S Pat. No. 4,810,333, and incorporated by reference herein, which include surfactant water soluble organic compounds such as compounds containing multiple oxyethylene groups, for example, polyoxyethylene polymers having about 20 to about 150 repeating units, and block copolymers of polyoxyethylene and polyoxypropylene. Polyethylene glycol is also a suitable levelling agent.

Preferred additives include one of the following:

(1) Copper Gleam PCM Plus, available from Lea Ronal Company and containing mixtures of disulfide brighteners and polyorganic oxide levelling agents;

(2) PC Gleam, a product of the Lea Ronal Company and containing mixtures of disulfide brighteners and polyorganic oxide levelling agents;

(3) PC667, available from the Electrochemicals Company and containing an organic dye system;

(4) Pluronic® L31, a product of the BASF Company and containing polyorganic oxides as levelling agents.

Examples of other chemical additives are stress relievers, depolarizers, plating suppressors, and wetting agents, as well as agents used for hardening, grain refining, reducing trees, and limiting current density. Thus, the term "chemical additives" as used herein is meant to include any of the above-mentioned agents.

The preferred composition for the electrolytic plating bath is that described in commonly owned and co-pending application Ser. No. 402,372, filed Sept. 5, 1989, to Foust et al., incorporated by reference herein, wherein the bath contains about 50 to about 275 grams per liter of an aqueous acidic metal electrolyte, about 30 to about 120 grams per liter of a strong acid, about 20 to about 500 parts per million of halide ions, and about 0.5 to about 6% by volume of at least one organic chemical additive comprising an organic levelling agent, an organic brightener, or a mixture of the foregoing.

Alternatively, two electrolytic metal layers may be applied to the electroless metal, as described in U.S. Pat. No. 4,873,136 to Foust et al. According to this reference, the first electrolytic layer, which is that layer disposed directly on the surface of the polyimide, can be substantially free of chemical additives normally present in an electrolytic layer, such as levelling agents and brighteners. The second electrolytic layer, which is applied onto the surface of the first electrolytic layer, is deposited from an additive-containing plating bath, such as any of the conventional baths known in the art and described previously herein.

After deposition of the electrolytic layer, the substrate is rinsed again with water and then heat-treated to further enhance adhesion of the metal layers to the substrate. A typical heat treatment for this step can involve temperatures ranging from about 50° C. to about 150° C. for a time period ranging from about 1 hour to about 24 hours.

Articles of various embodiments of this invention are suitable as printed circuit boards which would contain metallic layers as described herein in a printed circuit pattern or "trace".

In order that those skilled in the art will be better able to practice the present invention, the following examples are given by way of illustration and not by way of limitation.

In the following examples, adhesion of the metal to the substrate was evaluated by measuring the force necessary to peel strips of the metal from the substrate surface. In the test, the metal surface of each plated sample is etched into ⅛ inch strips. An end of each strip is clipped to an Ametek digital force measuring gauge which is connected to a computer processor. Force values required to lift the metal strips from the substrate are converted by the computer into pounds per inch peel values. Multiple peel values for each strip are obtained and then averaged.

EXAMPLES 1–4

Examples 1–4 illustrate the method of the present invention. Nitric acid is used in Examples 1–3, while hydrochloric acid is used in Example 4.

EXAMPLE 1

In Example 1, a 1 inch by 6 inch by 0.062 inch molded unfilled polyetherimide sample designated ULTEM®1000, a product of General Electric Company, having a specific gravity of 1.27, was treated as follows:

| Step | Procedure[a] |
|---|---|
| A. | 2 minutes in 1,1,2-trichlorotrifluoroethane, room temperature |
| B. | Dry |
| C. | 3 minutes in nitric acid (70%), 0.1% Fluorad FC95, 23° C. |
| D. | 3 minute water rinse |
| E. | Dry |
| F. | ½ minute in sulfuric acid (96%) 23° C. |
| G. | 2 minute water rinse |
| H. | 5 minutes KOH(5M), 23° C. |
| I. | 5 minutes $KMnO_4$ (15 g/L), KOH (1.2N), 75° C. |
| J. | 2 minute water rinse |
| K. | 5 minutes in $NH_2OH \cdot HCl$ (2.5%), 23° C. |
| L. | 2 minute water rinse |
| M. | 5 minutes Shipley Cleaner/Conditioner 1175A (2½%), 65° C. |
| N. | 2 minute water rinse |
| O. | 1 minute Shipley Cataprep 404, room temperature |
| P. | 3 minutes Shipley Cataposit 44(1½%), 44° C. |
| Q. | 2 minute water rinse |
| R. | 3 minutes Shipley Accelerator 19, room temperature |
| S. | 2 minute water rinse |
| T. | 30 minutes Shipley Cuposit 250, 48° C. |
| U. | 2 minute water rinse |
| V. | Dry |
| W. | 2 hours 95° C. |
| X. | 1 hour at 36 asf, 125 g/L $CuSO_4 \cdot 5H_2O$, 60 g/L $H_2SO_4$, 50 ppm $Cl^-$, |
| Y. | 16 hours at 110° C. |

[a]Substrates were immersed in the liquid components

EXAMPLE 2

A 1 inch by 6 inch by 0.062 inch molded unfilled ULTEM® polyetherimide sample having a specific gravity of 1.27 was treated as follows:

| Step | Procedure[a] |
|---|---|
| A. | 2 minutes in 1,1,2-trichlorotrifluoroethane, room temperature |
| B. | Dry |
| C. | 1 minute in nitric acid (70%), 0.1% Fluorad FC95, room temperature |
| D. | 5 minute water rinse |
| E. | Dry |
| F. | ½ minute in sulfuric acid (96%) room temperature |
| G. | 2 minute water rinse |
| H. | 5 minutes KOH(5N), room temperature |
| I. | 5 minutes $KMnO_4$ (15 g/L), KOH (1.2N), 75° C. |
| J. | 2 minute water rinse |
| K. | 5 minutes Shipley MLB Neutralizer 216, 53° C. |
| L. | 2 minute water rinse |
| M. | 5 minutes Shipley Cleaner/Conditioner 1175A(2½%), 65° C. |
| N. | 2 minute water rinse |
| O. | 1 minute Shipley Cataprep 404, room temperature |
| P. | 3 minutes Shipley Cataposit 44(1½%), 44° C. |
| Q. | 2 minute water rinse |
| R. | 3 minutes Shipley Accelerator 19 room temperature |
| S. | 2 minute water rinse |
| T. | 10 minutes Shipley Cuposit 250, 48° C. |
| U. | 2 minute water rinse |
| V. | Dry |
| W. | 2 hours 95° C. |
| X. | 1 hour, 30 asf, 140 g/L $CuSO_4 \cdot 5H_2O$, 50 g/L $H_2SO_4$, 175 ppm $Cl^-$, 3% Electrochemicals ElectroBrite PC 667, room temperature |
| Y. | 16 hours at 110° C. |

[a]Substrates were immersed in the liquid components

EXAMPLE 3

A 1 inch by 6 inch by 0.062 inch molded unfilled ULTEM® polyetherimide sample having a specific gravity of 1.27 was treated as follows: as follows:

| Step | Procedure[a] |
|---|---|
| A. | 2 minutes in 1,1,2-trichlorotrifluoroethane, room temperature |
| B. | Dry |
| C. | 1 minute in nitric acid (70%), Fluorad FC 95 (0.1%), room temperature |
| D. | 5 minute water rinse |
| E. | Dry |
| F. | ½ minute in sulfuric acid (96%), room temperature |
| G. | 2 minute water rinse |
| H. | 5 minutes in KOH(5N), room temperature |
| I. | 2 minute water rinse |
| J. | 5 minutes in cetylpyridinium chooride (1%), AF900(0.05%), aerated, 50° C. |
| K. | 2 minute water rinse |
| L. | 10 minutes in thiourea (12.5%), citric acid (1%), 75° C. |
| M. | 2 minute water rinse |
| N. | 5 minutes in Shipley Cleaner/Conditioner 1175A(2½%), 65° C. |
| O. | 2 minute water rinse |
| P. | 1 minute in Shipley Cataprep 404, room temperature |
| Q. | 3 minutes in Shipley Cataposit 44 (1½%), 44° C. |
| R. | 2 minute water rinse |
| S. | 3 minutes in Shipley Accelerator 19, room temperature |
| T. | 2 minute water rinse |
| U. | 10 minutes in Shipley Cuposit 250, 48° C. |
| V. | 2 minute water rinse |
| W. | Dry |
| X. | 2 hours at 75° C. |
| Y. | 1 hour, 30 asf, 140 g/L $CuSO_4 \cdot 5H_2O$, 50 g/L $H_2SO_4$, 175 ppm $Cl^-$, 3% Electrochemicals ElectroBrite PC667, room temperature |
| Z. | 16 hours at 95° C. |

[a]Substrates were immersed in the liquid components

EXAMPLE 4

In this example, a 1 inch by 6 inch by 0.062 inch molded unfilled ULTEM® 1000 polyetherimide sample having a specific gravity of 1.27 was treated as follows:

| Step | Procedure[a] |
|---|---|
| A. | 2 minutes in 1,1,2-trichlorotrifluoroethane, room temperature |
| B. | Dry |
| C. | 5 minutes in hydrochloric acid (35%), room temperature |
| D. | 2 minute water rinse |
| E. | Dry |
| F. | ½ minute in sulfuric acid (96%), room temperature |
| G. | 2 minute water rinse |
| H. | 5 minutes in KOH(5N), room temperature |
| I. | 5 minutes in KMnO$_4$ (15 g/L), KOH (1.2N), 75° C. |
| J. | 2 minute water rinse |
| K. | 5 minutes in Shipley MLB Neutralizer 216, 53° C. |
| L. | 2 minute water rinse |
| M. | 5 minutes in Shipley Cleaner/Conditioner 1175A(2½%), 65° C. |
| N. | 2 minute rinse |
| O. | 1 minute in Shipley Cataprep 404, room temperature |
| P. | 3 minutes in Shipley Cataposit 44 (1½%), 44° C. |
| Q. | 2 minute water rinse |
| R. | 3 minutes in Shipley Accelerator 19, room temperature |
| S. | 2 minute water rinse |
| T. | 5 minutes in Shipley Cuposit 250, 48° C. |
| U. | 2 minute water rinse |
| V. | Dry |
| W. | 2 hours at 75° C. |
| X. | 1 hour, 30 asf, 140 g/L CuSO$_4$.5H$_2$O, 50 g/L H$_2$SO$_4$, 175 ppm Cl$^-$, 3% Electrochemicals ElectroBrite PC667, room temperature |
| Y. | 16 hours at 95° C. |

[a]Substrates were immersed in the liquid components

After being cooled to room temperature, the samples in Examples 1–4 were tested for adhesion by the method described above. The results are shown in Table 1 below.

TABLE 1

| Example No. | Adhesion Peel Strength (lb/in) |
|---|---|
| 1 | 9.0 |
| 2 | 12.8 |
| 3 | 11.4 |
| 4 | 3.8 |

Nitric acid and hydrochloric acid were both found to be effective in etching an unfilled polyetherimide substrate. The surface modification resulting from the use of either acid was effective in preventing blistering during electroless copper deposition. However, as can be seen from the adhesion peel strength data shown in Table 1 above, the adhesion between the substrate and the deposited metal when hydrochloric acid is used is substantially lower than that obtained with the use of nitric acid.

EXAMPLES 5–11

Various grades of unfilled ULTEM® polyetherimide resins were treated according to the procedure followed in Example 1 except that in Examples 5–11 the dwell time in nitric acid was 30 seconds rather than 3 minutes. The peel strength data obtained in these examples are shown in Table 2.

TABLE 2

Peel Strength Data for Unfilled Grades of ULTEM ® Resin

| Example No. | ULTEM ® | Peel Strength |
|---|---|---|
| 5 | 1000 | 5.1 |
| 6 | 1010 | 6.3 |
| 7 | 1000 film (10 mil) | 12.3 |
| 8 | 1000 film (5 mil) | 5.0 |
| 9 | 5000 | 14.1 |

TABLE 2-continued

Peel Strength Data for Unfilled Grades of ULTEM ® Resin

| Example No. | ULTEM ® | Peel Strength |
|---|---|---|
| 10 | 6000 | 5.5 |
| 11 | HPA-II | 10.3 |

In Examples 12–21 below, unfilled polyetherimide samples were treated in the manner indicated in Example 2 above except for steps C and F which were varied as described below.

EXAMPLES 12–14

Examples 12–14 illustrate (1) the effect on a polyimide substrate of the length of its dwell time in nitric acid and (2) the effect from the presence of a surfactant on the diffusion of nitric acid into the polyetherimide.

In these examples, a 5 mil thick sample of an unfilled polyetherimide was immersed in concentrated (70%) nitric acid at room temperature for 2–5 minutes, rinsed in water for 15 seconds, and then immersed into a water bath for 5 minutes.

A surfactant was used in Examples 13 and 14. The surfactant was a potassium perfluoroalkyl sulfonate surfactant available from 3M Company and designated "FC-95".

The respective dwell times used and diffusion data obtained in the examples are shown in Table 2 below.

TABLE 2

HNO$_3$ Diffusion Data

| Example Number | Surfactant (FC 95) in HNO$_3$ | Dwell Time in HNO$_3$ (min) | H$^+$ Back Diffusion in 5 minutes (mmole/cm$^2$) |
|---|---|---|---|
| 12 | No | 2 | 1.67 × 10$^{-3}$ |
| 13 | Yes | 2 | 2.55 × 10$^{-3}$ |
| 14 | Yes | 5 | 4.89 × 10$^{-3}$ |

The diffusion data shown in Table 2 above indicates that immersion into a water bath of a polyetherimide sample which had been previously been immersed in concentrated nitric acid and rinsed with water as described above results in a lower pH of the water bath. This indicates the diffusion of nitric acid back out of the water bath which in turn indicates that during the immersion period the nitric acid diffused into the polymer structure instead of remaining on the polymer's surface. If nitric acid had remained on the polyimide surface during immersion, the acid would have been removed during the subsequent rinsing step and no change in the pH would have occurred in the water bath subsequently immersed with the polyetherimide sample. The addition of a surfactant to the nitric acid and an increase in dwell time in the nitric acid increases the pH change observed, indicating the increase in diffusion of nitric acid which occurs in the presence of a surfactant or at increased dwell times.

As mentioned previously herein, over-diffusion of nitric acid into the polyimide is undesirable. If too much nitric acid is present in the polyimide, over-etching of the plastic can occur, making the anchor sites less effective. The effect of nitric acid dwell time on the peel strength of a polyimide-metal composite is demonstrated in Examples 15–19 below.

EXAMPLES 15-19

In Examples 15-19, the procedure followed in Example 1 was repeated except that the dwell times in nitric acid varied as shown in Table 3 below. The peel strenths of the composites formed in these examples are also shown in Table 3.

TABLE 3

Effect of Dwell Time in HNO$_3$ on Peel Strength

| Example No. | Time in HNO$_3$ (Min) | Peel Strength (lb/in) |
|---|---|---|
| 15 | 0 | Blisters |
| 16 | 0.25 | 6.1 |
| 17 | 0.5 | 8.7 |
| 18 | 1.0 | 9.0 |
| 19 | 5.0 | 6.8 |

As can be seen from the data shown in Table 3, dwell times which are too long have a deleterious effect on the peel strength of the composite.

EXAMPLES 20-22

The effect of the order of treatment with nitric acid and sulfuric acid on the chemistry of a polyimide surface is illustrated in Examples 20-22.

In Example 20, the polyetherimide surface was treated first with nitric acid and then with sulfuric acid, in accordance with the procedure used in Example 1. In Example 21, the polymer surface was treated with nitric acid and sulfuric acid simultaneously. The polyimide surface in Example 22 was left untreated.

Etching occurred in Example 20 wherein the polymer surface was treated first with nitric acid and then with sulfuric acid. The treatment of the polyimide surface with nitric acid and sulfuric acid simultaneously in Example 21 resulted in no etching of the polymer surface. In addition, samples of the polyetherimide treated simultaneously with the nitric acid and sulfuric acid blistered when plated with electroless copper following the treatment.

In addition to physical differences, X-ray photoelectron spectroscopic analyses showed that chemical differences in the polyetherimide surfaces treated in Examples 20 and 21 as compared to the untreated polyetherimide surface in Example 22 also existed. These differences are shown in Tables 4 and 5 below.

TABLE 4

X-ray Photoelectron Spectroscopic Data

| Example | Surface Composition (%) | | |
|---|---|---|---|
| | C | O | N |
| 20 | 82.4 | 14.3 | 3.3 |
| 21 | 74.8 | 16.9 | 6.8 |
| 22 | 82.2 | 13.3 | 4.4 |

TABLE 5

X-ray Photoelectron Spectroscopic Data
Binding Energies (eV), %, Assignments

| Example | C | O | N |
|---|---|---|---|
| 20 | 284.6(73)<br>286.1(18)<br>288.4(6)<br>291.3(3) | 531.7(49)<br>533.1(46)<br>538.9(5) | 400.1(100) |
| 21 | 284.6(80)<br>286.1(10)<br>288.3(6)<br>291.1(3) | 531.6(28)<br>533.2(72) | 399.9(41)<br>402.1(8)<br>405.5(13)<br>407.3(38) |
| 22 | 284.6(80)C—C<br>286.1(13)C—O<br>288.2(8)N—C=O | 531.6(60)O=C<br>533.2(40)O—C | 400.1(100)<br>=CO—N—CO |

The data shown in Tables 4 and 5 above indicate that unfilled polyetherimide samples treated first with nitric acid and then sulfuric acid followed by subsequent treatment with potassium permanganate left a slightly oxidized surface typical for samples treated with potassium permanganate whereas samples treated simultaneously with nitric acid and sulfuric acid and then with potassium permanganate produced a polymer surface that had been nitrated.

EXAMPLES 23-30

Examples 23-30 illustrate the application of the process of this invention to polyimides containing fillers. The polyimides used in these examples are various filled grades of ULTEM® polyetherimides.

The procedure carried out in Example 2 above was repeated in Examples 23-30. The same procedure was used in Example 30 except that the polyimide surface was not treated by nitric acid, i.e., step C was omitted. Adhesion peel strength data for these examples are provided in Table 6 below.

TABLE 6

Peel Strength Data for Filled Grades of ULTEM® Resin

| Example No. | Filler | Peel Strength (lb/in) |
|---|---|---|
| 23 | 30% Glass | 9.2 |
| 24 | 20% Glass | 10.2 |
| 25 | 30% Glass/15% TiO2 | 11.2 |
| 26 | 20% Mica | 6.0 |
| 27 | 20% Mineral | 7.4 |
| 28 | 10% Glass/<br>10% Nickel-Coated Graphite | 9.1 |
| 29 | 30% Glass/<br>1.5% Carbon Black | 9.0 |
| 30 | 30% Glass | 12.0 |

The peel strength data set forth in Table 6 show that the filled grades of polyetherimides treated with nitric acid have lower adhesion to the plated metal than the filled polyetherimide untreated with nitric acid.

EXAMPLE 31

Example 31 illustrates the treatment of an unfilled polyetherimide sample with the vapors of nitric acid.

In this example, the procedure of Example 2 was repeated except that in step C the polyimide substrate was not immersed in a liquid solution of nitric acid but rather was suspended over a liquid nitric acid solution at 40° C. for 5 minutes. The nitric acid had a concentration of 70%. In step D of Example 31, the acid-treated polyimide was dried in air rather than rinsed in water.

The composite formed in this example had a peel strength of 9.0 lb/in, comparable to that obtained with the use of liquid nitric acid.

What is claimed is:

1. A method for pretreating a polyimide surface in preparation for an adhesion promotion treatment and subsequent metallization on the surface, comprising the steps of:

(A) contacting the polyimide surface with an aqueous solution of nitric acid having a concentration of about 35 to about 70% by weight or an aqueous solution of hydrochloric acid having a concentration of about 10 to about 38% by weight;

(B) rinsing the acid-treated polyimide surface with water so as to substantially remove the acid from the surface of the polyimide;

(C) contacting the rinsed polyimide surface with a mild etching agent, resulting in the formation of a residual film on the polyimide surface;

(D) contacting the etched polyimide surface with a basic solution, and (E) removing the residual film formed on the surface of the polyimide after contact with the mild etching agent in step (C).

2. A method according to claim 1 wherein the acid is nitric acid.

3. A method according to claim 2 wherein the nitric acid has a concentration of about 50 to about 70% by weight.

4. A method according to claim 3 wherein the nitric acid has a concentration of about 65 to about 70% by weight.

5. A method according to claim 1 wherein the acid is hydrochloric acid.

6. A method according to claim 5 wherein the hydrochloric acid has a concentration of about 25 to about 38% by weight.

7. A method according to claim 6 wherein the hydrochloric acid has a concentration of about 30 to about 38% by weight.

8. A method according to claim 1 wherein the polyimide surface is treated with the aqueous acid solution for a period of about 15 seconds to about 10 minutes.

9. A method according to claim 8 wherein the polyimide surface is treated with the aqueous acid solution for a period of about 2 to about 10 minutes.

10. A method according to claim 1 wherein in step (A) the aqueous solution of acid further comprises an inert surfactant.

11. A method according to claim 10 wherein the surfactant is an anionic fluorocarbon.

12. A method according to claim 11 wherein the surfactant is a potassium perfluoroalkyl sulfonate.

13. A method according to claim 10 wherein the aqueous acid solution contains about 0.001% to about 1.0% by weight of the surfactant based on the amount of acid.

14. A method according to claim 13 wherein the aqueous acid solution contains about 0.01% to about 1.0% by weight of the surfactant based on the amount of acid.

15. A method according to claim 14 wherein the aqueous acid solution contains about 0.1% to about 1.0% by weight of the surfactant based on the amount of acid.

16. A method according to claim 1 wherein in step (B), the polyimide surface is rinsed with water for about 30 seconds to about 20 minutes.

17. A method for pretreating a polyimide surface in preparation for an adhesion promotion treatment and subsequent metallization on the surface, comprising the steps of:

(A) contacting the polyimide surface with a mixture containing nitric acid having a concentration of about 65% to about 70% and about 0.1% to about 1.0% by weight of a potassium perfluoroalkyl sulfonate surfactant;

(B) rinsing the nitric-acid-treated polyimide surface with water for about 30 seconds to about 20 minutes;

(C) contacting the rinsed polyimide surface with sulfuric acid having a concentration of at least 85%;

(D) contacting the etched polyimide surface with potassium hydroxide, and (E) contacting the potassium hydroxide-treated polyimide surface with an aqueous solution of an alkali metal permanganate.

18. A method for pretreating a polyimide surface in preparation for an adhesion promotion treatment and subsequent metallization on the surface, comprising the steps of:

(A) contacting the polyimide surface with a mixture containing hydrochloric acid having a concentration of about 30% to about 38% and about 0.1% to about 1.0% by weight of a potassium perfluoroalkyl sulfonate surfactant;

(B) rinsing the hydrochloric-acid-treated polyimide surface with water for about 30 seconds to about 20 minutes;

(C) contacting the rinsed polyimide surface with sulfuric acid having a concentration of at least 85%;

(D) contacting the etched polyimide surface with potassium hydroxide, and (E) contacting the potassium hydroxide-treated polyimide surface with an aqueous solution of an alkali metal permanganate.

* * * * *